(12) United States Patent
Hsieh et al.

(10) Patent No.: US 6,297,099 B1
(45) Date of Patent: Oct. 2, 2001

(54) METHOD TO FREE CONTROL TUNNELING OXIDE THICKNESS ON POLY TIP OF FLASH

(75) Inventors: Chia-Ta Hsieh, Tainan; Di-Son Kuo; Jack Yeh, both of Hsin-Chu; Chrong Jung Lin, Hsin-Tien; Wen-Ting Chu, Allen; Chung-Li Chang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/765,045

(22) Filed: Jan. 19, 2001

(51) Int. Cl.[7] .............................................. H01L 21/8247
(52) U.S. Cl. ............................................ 438/266; 438/981
(58) Field of Search .................................. 438/261, 264, 438/266, 267, 981

(56) References Cited

U.S. PATENT DOCUMENTS

| | | | |
|---|---|---|---|
| 5,330,938 | 7/1994 | Camerlenghi | 437/57 |
| 5,453,388 | 9/1995 | Chen et al. | 437/30 |
| 5,879,992 | 3/1999 | Hsieh et al. | 438/264 |
| 5,950,087 | 9/1999 | Hsieh et al. | 438/264 |
| 5,970,371 | 10/1999 | Hsieh et al. | 438/593 |
| 6,001,690 | * 12/1999 | Chien et al. | 438/266 |
| 6,046,086 | * 4/2000 | Lin et al. | 438/981 |
| 6,090,668 | * 6/2000 | Lin et al. | 438/266 |

* cited by examiner

*Primary Examiner*—Chandra Chaudhari
(74) *Attorney, Agent, or Firm*—George O. Saile; Stephen B. Ackerman; Stephen G. Stanton

(57) ABSTRACT

A method of fabricating a floating gate/word line device, comprising the following steps. A semiconductor structure is provided. A floating gate portion is formed over the semiconductor structure. The floating gate portion having side walls and a top surface. A poly-oxide portion is formed over the top surface of the floating gate. An interpoly oxide layer is formed over the semiconductor structure, the poly-oxide portion and the poly-oxide portion. The interpoly oxide layer having an initial thickness and includes: a word line region portion over at least a portion of the semiconductor structure adjacent the floating gate portion; side wall area portions over the floating gate portion side walls; and a top portion over the poly-oxide portion. The initial thickness of the top portion of the interpoly oxide layer is reduced to a second thickness without reducing the initial thickness of the interpoly oxide word line region portion or an appreciable portion of the interpoly oxide side wall area portion. A polysilicon layer is formed over the interpoly oxide layer. The structure is patterned to form a floating gate/word line device.

23 Claims, 4 Drawing Sheets

METHOD TO FREE CONTROL TUNNELING OXIDE THICKNESS ON POLY TIP OF FLASH

FIELD OF THE INVENTION

The present invention relates generally to fabrication of integrated circuit devices and specifically to fabrication of floating gates that may be used in FLASH memory devices.

BACKGROUND OF THE INVENTION

The interpoly/oxide thickness of the poly tip of a floating gate is limited by the thickness of the sidewall oxide of the floating gate. A thinner interpoly oxide would increase erasing speed, but would also decrease the programming speed due to the decreased source/floating gate coupling ratio. A thicker interpoly oxide would decrease erasing speed and endurance.

The interpoly oxide thickness of the poly tip is also limited by the word line oxide of the source/drain area. A thinner interpoly oxide would again increase erasing speed but would reduce the oxide breakdown strength of the word line when erasing with high voltage force.

For example, U.S. Pat. Nos. 5,879,992, 5,950,087, and 5,970,371 all to Hsieh et al describe split gate processes with interpoly oxide layers.

U.S. Pat. No. 5,453,388 to Chen et al. describes a split gate EEPROM with an interpoly oxide layer.

U.S. Pat. No. 5,330,938 to Camerlenghi describes another split gate process.

SUMMARY OF THE INVENTION

Accordingly, it is an object of the present invention is to provide an method to fabricate a floating gate/word line having increased erasing speed while maintaining the programming speed and the oxide breakdown strength of the word line when erasing with high voltage force.

Another object of the present invention is to provide a method to fabricate an interpoly/oxide at the poly tip of a floating gate with a thickness thinner than the interpoly/oxide at the sidewalls of the floating gate and thinner than the word line oxide.

Other objects will appear hereinafter.

It has now been discovered that the above and other objects of the present invention may be accomplished in the following manner. Specifically, a semiconductor structure is provided. A floating gate portion is formed over the semiconductor structure. The floating gate portion having side walls and a top surface. A poly-oxide portion is formed over the top surface of the floating gate. An interpoly oxide layer is formed over the semiconductor structure, the poly-oxide portion and the poly-oxide portion. The interpoly oxide layer having an initial thickness and includes: a word line region portion over at least a portion of the semiconductor structure adjacent the floating gate portion; side wall area portions over the floating gate portion side walls; and a top portion over the poly-oxide portion. The initial thickness of the top portion of the interpoly oxide layer is reduced to a second thickness without reducing the initial thickness of the interpoly oxide word line region portion or an appreciable portion of the interpoly oxide side wall area portion. A polysilicon layer is formed over the interpoly oxide layer. The structure is patterned to form a floating gate/word line device.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Method Known to the Inventors

The following method known to the inventors is not to be considered prior art for the purposes of the invention.

In the traditional method of forming a floating gate/word line known to the inventors a floating gate oxide layer is formed over a semiconductor structure (silicon substrate). A floating gate polysilicon oxide (poly ox) layer is then formed and patterned over the semiconductor structure. An interpoly oxide layer is then grown (HTO of thermal oxide or composite), to a uniform thickness of from about 150 to 400Å, over the word line region, the side wall area of the floating gate poly ox, and the top of the patterned poly ox.

Preferred Embodiment of the Present Invention

Unless otherwise specified, all structures, layers, steps, methods, etc. may be formed or accomplished by conventional steps or methods known in the prior art.

Initial Structure

The initial structure of the present invention may be formed, for example, as disclosed in the Hsieh et al. U.S. Pat. No. 5,879,992 at col. 5, lines 66, 67to col. 5, lines 1to 47and shown in the 5,879,992Hsieh et al. Pat. FIGS. 2a through 2e unless otherwise indicated.

Figure 1:
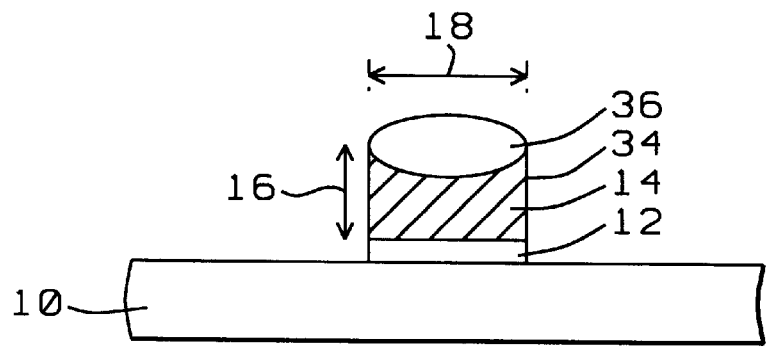
FIGS. 1 to 7 illustrate the preferred embodiment of the present invention.

Accordingly, as shown in FIG. 1, a floating gate layer is formed over semiconductor structure 10 (silicon substrate) to a thickness of preferably from about 75 to 85Å, and more preferably about 80Å.

A floating gate poly layer is formed over the floating gate oxide layer and both are patterned to form floating gate poly portion 14 and floating gate oxide 12 using a poly-oxide portion 36 (previously formed over the top surface of the floating gate portion before an etching step) as a mask (see the 5,879,992 Hsieh et al. Pat. referenced above). Floating gate poly portion 14 is formed to a thickness 16 of preferably from about 900 to 1100Åand more preferably about 1000Å, and has a width 18 of preferably from about 1100 to 1300 Åand more preferably about 1200Å. Floating gate poly portion 14 has sidewalls 34.

Figure 2:
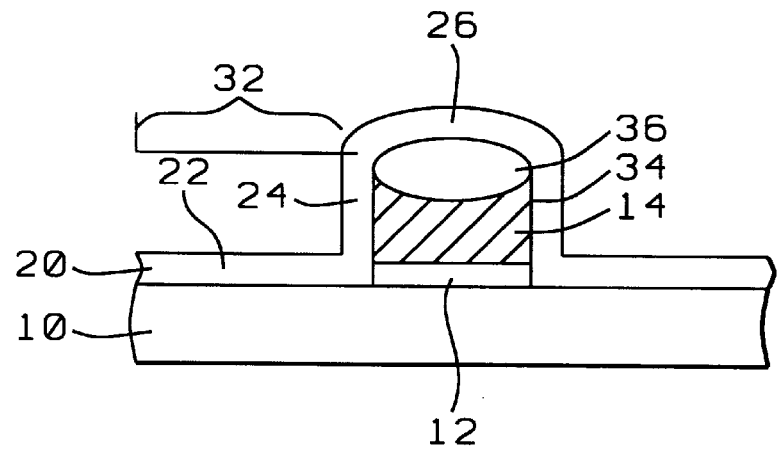

As shown in FIG. 2, interpoly oxide layer 20 is formed over the structure of FIG. 1 to an essentially uniform thickness of preferably from about 140 to 410Åand more preferably from about 150 to 400Å. Interpoly oxide layer 20 may be grown (high temperature oxidation (HTO), thermal oxidation, or composite). Interpoly oxide layer 20 comprises: word line region portion 22 over word line region 32 over silicon substrate 10; side wall area portions 24 over side walls 34 of floating gate poly portion 14; and poly tip portion 26 over the poly oxide portion 36.

The structure of FIG. 2, is essentially the same as the structure formed by the traditional method known to the inventors.

Key Steps of the Invention

The interpoly oxide word line region portion 22 needs to be thick enough to resist high voltage (i.e. about 13 voltage)

stress during erasing. The interpoly oxide side wall area portion 24 needs to be thick enough to provide enough of a coupling ratio of source/floating gate to obtain a faster programming speed. However, the top portion 26 needs to be thin to obtain enough P-N tunneling probability during erasing, which also achieves a faster erasing speed and increased endurance due to less oxide trapping. These requirements are the reverse request for cell operation, and it is not possible to define differing interpoly oxide layer 20 regions 22, 24, 26 by the mask method used in the traditional method known to the inventors.

The key steps of the invention are shown in FIGS. 3, 4, 5, and 6.

Figure 3:
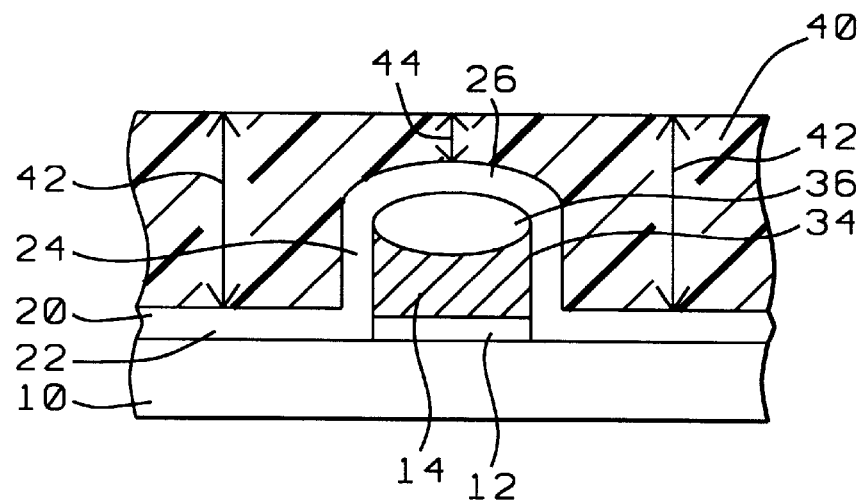

As shown in FIG. 3, photoresist (PR) layer 40 is formed over interpoly oxide layer 20. PR layer 40 is essentially planar and has: a thickness 42 of preferably from about 2800 to 8200Å and more preferably from about 3000 to 8000Å over interpoly oxide word line region portion 22; and a thickness 44 of preferably from about 1300 to 6200Å and more preferably from about 1500 to 6000Å over top portion 26. PR layer 40 is preferably formed of BARC with a thickness of from about 1000 to 1500Å at 42 and from about 200 to 700 at 44 over the top portion 26.

Figure 4:
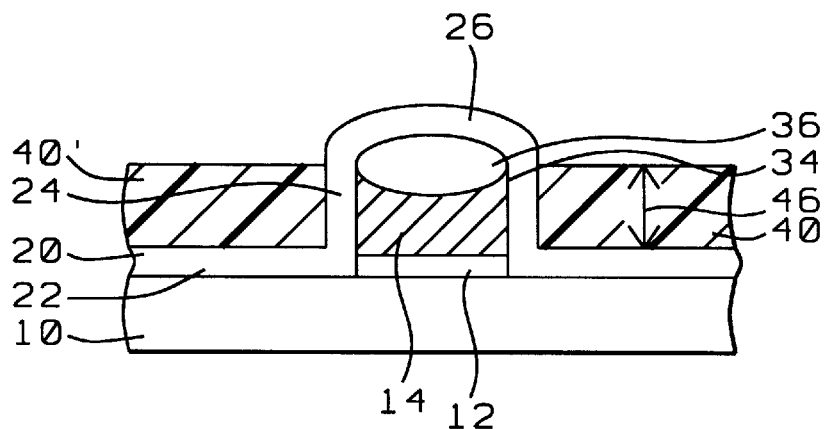

As shown in FIG. 4, PR layer 40 is etched back by catching the endpoint of PR to interpoly oxide layer 20 interface to ensure top portion 26 is exposed. Etched back PR layer 40' has a thickness 46 preferably from about 590 to 910Å and more preferably from about 600 to 900Å and is less than the thickness 16 of floating gate poly portion 14. PR layer 40 is etched back with a dry etch process using $O_2$ gas (majority), with other gasses possible such as $Cl_2$ or He, so that interpoly oxide poly tip portion 26 is exposed.

Figure 5:
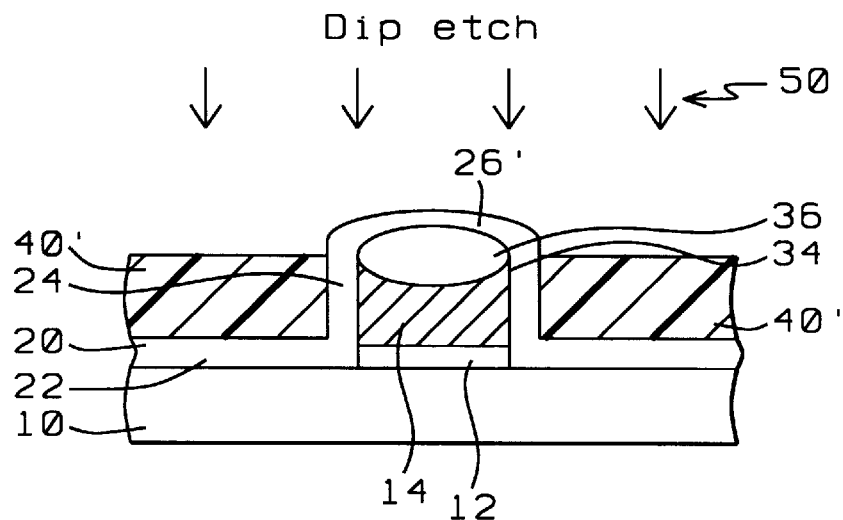

As shown in FIG. 5, the top portion 26 is subjected to a dry gas etch using F, for example, or a wet dip etch using BOE or HF, for example.

The word line portion 22 and the side wall area portions 24 of the interpoly oxide layer 20 (to become either interpoly oxide word line or high voltage MOS oxide, for example) are not attacked or etched by dry or wet dip etch 50 because of protective etched back PR layer 40 and retains the thickness necessary to resist the stress and high electric field for word line or HVMOS.

The final thinned top portion 26' of the interpoly oxide layer 20 (see FIG. 6) has a thickness from preferably from about 45 to 155Å or greater, or more preferably from about 50 to 150 A or greater. Alternatively, the top portion 26' may be completely cleared off and a new interpoly oxide layer top portion 26' with the desired thickness may be re-grown. This provides free control of the thickness of the final thinned top portion 26'.

The thickness of final thinned top portion 26' of interpoly oxide layer 20 may thus be accurately controlled to permit increased F-N tunneling during erasing and increased endurance due to less oxide trapping while the thickness of interpoly oxide word line region portion 22 is sufficient to resist high voltage stress during erasing and the thickness of interpoly oxide side wall area portion 24 is sufficient to provide enough of a coupling ratio of source/floating gate to obtain a faster programming speed. (See FIGS. 8A, 8B; and 9A, 9B)

Figure 6:
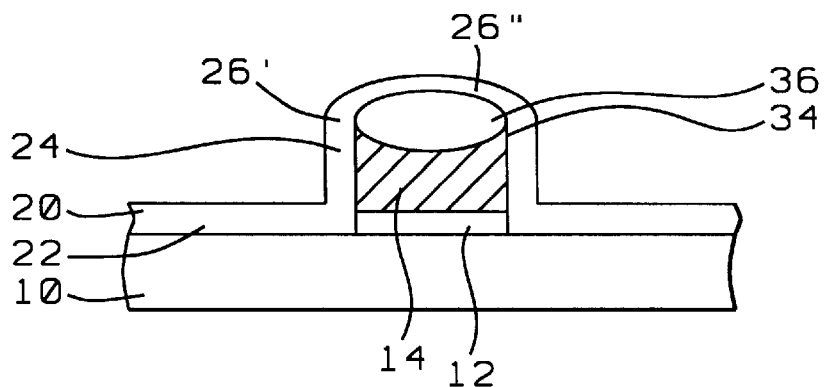

As shown in FIG. 6, etched back PR layer 40' is stripped and removed.

Formation of Polysilicon (Poly-2) Layer as Word Line

Figure 7:
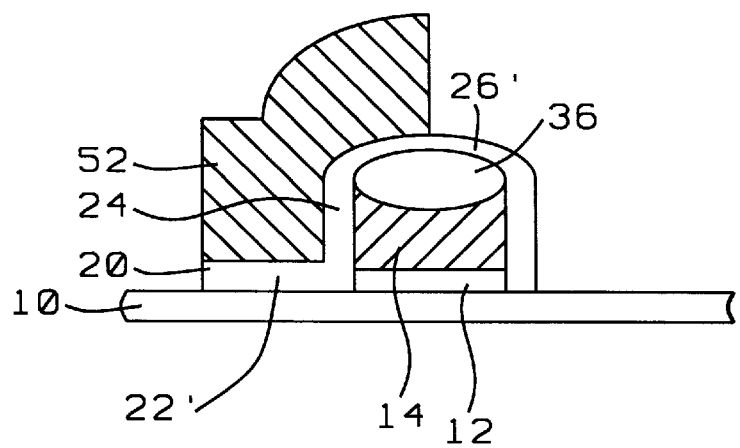

As shown in FIG. 7, a polysilicon (poly-2) layer is formed over the structure and the structure is patterned to form, for example, polysilicon word line 52 over patterned word line region portion 22', one side of side wall area portion 24, and a portion of final thinned interpoly oxide poly tip portion 26'. The polysilicon layer may be formed of polysilicon or amorphous silicon (A-Si).

Figure 8A:
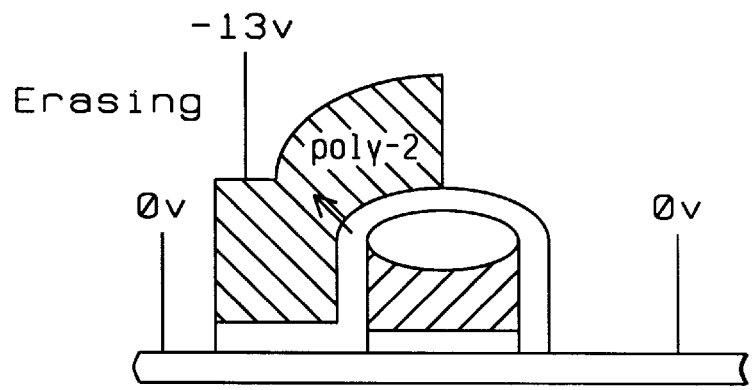
FIGS. 8A and 9A schematically illustrate erasing and programming of a floating gate/word line device made in accordance with a traditional method known to the inventors.
Figure 8B:
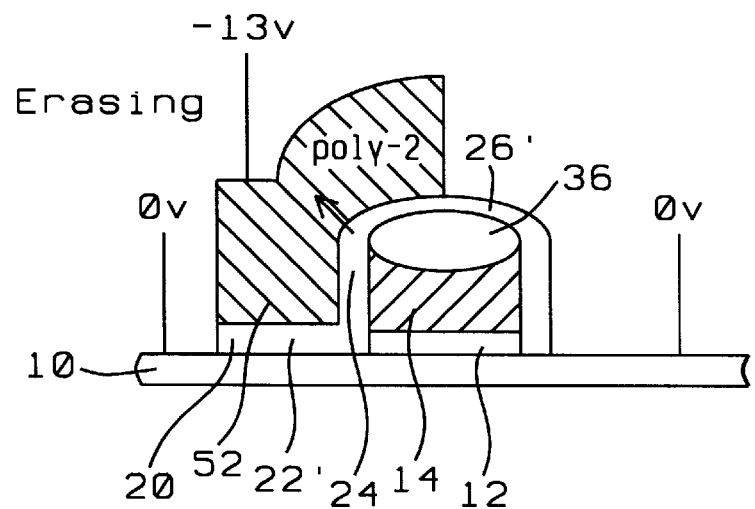
FIGS. 8B and 9B schematically illustrate erasing and programming of a floating gate/word line device made in accordance with the present invention.

Comparison of Traditional Method Known to the Inventors and the Method of the Invention FIG. 8A illustrates erasing of a floating gate/word line device fabricated in accordance with the traditional method known to the inventors while FIG. 8B illustrates erasing of a floating gate/word line device fabricated in accordance with the present invention.

The thicker interpoly oxide of the poly tip/top portion of the traditional floating gate/word line device, dictated by the thickness of the word line interpoly oxide layer, decreases the erasing speed and provides worse endurance performance. The thinner final thinned interpoly oxide of the poly tip/top portion 26' of the floating gate/word line device of the present invention increases the erasing speed and provides better endurance performance.

Figure 9A:
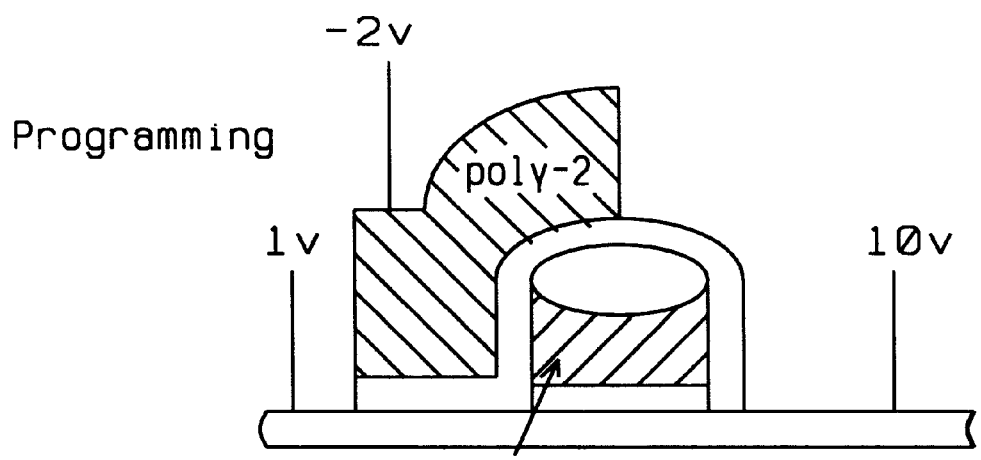
Figure 9B:
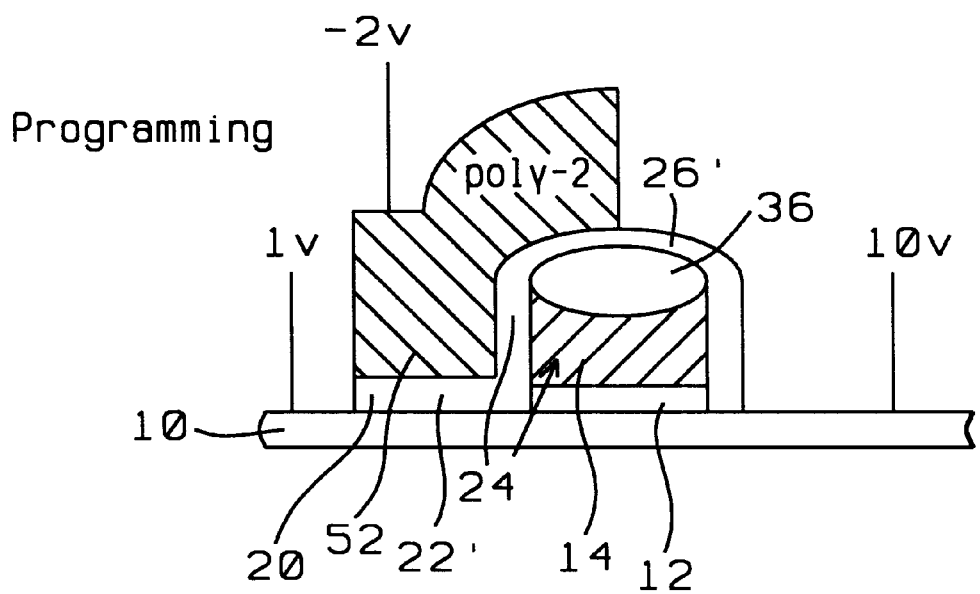

FIG. 9A illustrates programming of a floating gate/word line device fabricated in accordance with the traditional method known to the inventors while FIG. 9B illustrates programming of a floating gate/word line device fabricated in accordance with the present invention.

The thickness of the interpoly oxide of the poly tip/top portion of the traditional floating gate/word line device is dictated by the thickness of the word line interpoly oxide layer which does not permit increasing of the thickness of the interpoly oxide side wall area portion of the interpoly oxide layer as much as possible to achieve faster programming speed. However, because of the thickness free control in the formation of the final thinned interpoly oxide of the poly tip/top portion 26' made in accordance with the present invention, the interpoly oxide side wall area portion 24 may be made thicker to increase the programming speed by a coupling ratio improvement.

Summarization of the Present Invention A photoresist (PR) / BARC layer 40 is formed over the interpoly oxide layer 20 and is then etched back to form etched back PR layer 40'to expose the top portion 26 of the interpoly oxide layer 20, but not the source/drain. The top portion 26 is then subjected to a dry or wet dip etch 50 to formed a thinned top portion 26'. The final thinned top portion 26' has a thickness of more preferably from about 50 to 150 Å. This allows for a faster erasing speed, better endurance (by thinner oxide of the final thinned top portion 26' ), and faster programming speed (by better coupling with thicker oxide of the interpoly oxide side wall area portion 24).

Advantages of the Present Invention

The advantages of the present invention include:
1) faster erasing speed;
2) better endurance;
3) faster programming speed; and
4) free control of the thickness of the final thinned interpoly oxide poly tip portion 26'.

While particular embodiments of the present invention have been illustrated and described, it is not intended to limit the invention, except as defined by the following claims.

We claim:

1. A method of fabricating a floating gate/word line device, comprising the steps:

providing a semiconductor structure;

forming a floating gate portion over the semiconductor structure; the floating gate portion having side walls and a top surface;

forming a poly-oxide portion over the top surface of the floating gate;

forming an interpoly oxide layer over the semiconductor structure, the poly-oxide portion and the poly-oxide portion; the interpoly oxide layer having an initial thickness and including:
  a word line region portion over at least a portion of the semiconductor structure adjacent the floating gate portion;
  side wall area portions over the floating gate portion side walls; and
  a top portion over the poly-oxide portion;
reducing the initial thickness of the top portion of the interpoly oxide layer to a second thickness without reducing the initial thickness of the interpoly oxide word line region portion or an appreciable portion of the interpoly oxide side wall area portion;
forming a polysilicon layer over the interpoly oxide layer; and
patterning the structure to form a floating gate/word line device.

2. The method of claim 1, wherein the floating gate portion is from about 900to 1100A thick and from about 1100to 1300Åwide.

3. The method of claim 1, wherein the floating gate portion is about 1000A thick and about 1200Åwide.

4. The method of claim 1, wherein the initial thickness of the interpoly oxide layer is from about 140 to 410Å; and the second thickness of the top portion is from about 45 to 155Å.

5. The method of claim 1, wherein the initial thickness of the interpoly oxide layer is from about 150 to 400Å; and the second thickness of the top portion is from about 50 to 150Å.

6. The method of claim 1, wherein the initial thickness of the top portion of the interpoly oxide layer is reduced to the second thickness by:
  forming a photoresist layer over the interpoly oxide layer to at least cover the top portion of the interpoly oxide layer;
  etching back the photoresist layer to expose the top portion of the interpoly oxide layer; and
  etching the exposed top portion whereby the initial thickness of the top portion is reduced to the second thickness; the second thickness being from about 45 to 155Å.

7. The method of claim 1, wherein the initial thickness of the top portion of the interpoly oxide layer is reduced to the second thickness by:
  forming a photoresist layer over the interpoly oxide layer to at least cover the top portion of the interpoly oxide layer;
  etching back the photoresist layer to expose the top portion of the interpoly oxide layer; and
  etching the exposed top portion whereby the initial thickness of the top portion is reduced to the second thickness; the second thickness being from about 50 to 150Å.

8. The method of claim 1, wherein the initial thickness of the top portion is reduced to the second thickness by:
  forming a photoresist layer over the interpoly oxide layer to at least cover the top portion of the interpoly oxide layer;
  etching back the photoresist layer to expose the top portion of the interpoly oxide layer;
  etching the exposed top portion to reduce the initial thickness of the top portion to an intermediate thickness of less than about 45 to 155A; and
  forming additional interpoly oxide on the etched exposed top portion to increase the intermediate thickness to the second thickness of from about 45 to 155Å.

9. The method of claim 1, wherein the initial thickness of the top portion is reduced to the second thickness by:
  forming a photoresist layer over the interpoly oxide layer to at least cover the top portion of the interpoly oxide layer;
  etching back the photoresist layer to expose the top portion of the interpoly oxide layer;
  etching the exposed top portion to reduce the initial thickness of the top portion to an intermediate thickness of less than about 50 to 150 A; and
  forming additional interpoly oxide on the etched exposed top portion to increase the intermediate thickness to the second thickness of from about 50 to 150Å.

10. A method of fabricating a floating gate/word line device, comprising the steps:
  providing a semiconductor structure;
  forming a floating gate portion over the semiconductor structure; the floating gate portion having side walls and a top surface; the floating gate portion being from about 900to 1100ÅA thick and from about 1100to 1300Åwide;
  forming a poly-oxide portion over the top surface of the floating gate;
  forming an interpoly oxide layer over the semiconductor structure, the floating gate portion and the poly-oxide portion; the interpoly oxide layer having an initial thickness of from about 140 to 410Åand including:
    a word line region portion over at least a portion of the semiconductor structure adjacent the floating gate portion;
  side wall area portions over the floating gate portion side walls; and
  a top portion over the poly-oxide portion;
  reducing the initial thickness of the top portion of the interpoly oxide layer to a second thickness without reducing the initial thickness of the interpoly oxide word line region portion or an appreciable portion of the interpoly oxide side wall area portion;
  forming a polysilicon layer over the interpoly oxide layer; and
  patterning the structure to form a floating gate/word line device.

11. The method of claim 10, wherein the second thickness of the top portion of the interpoly oxide layer is from about 45 to 155Å.

12. The method of claim 10, wherein the floating gate portion is about 1000A thick and about 1200Åwide; the interpoly oxide layer initial thickness is from about 150 to 400Å; and the second thickness of the top portion of the interpoly oxide layer is from about 50 to 150 A.

13. The method of claim 10, wherein the initial thickness of the top portion of the =interpoly oxide layer is reduced to the second thickness by:
  forming a photoresist layer over the interpoly oxide layer to at least cover the top portion of the interpoly oxide layer;
  etching back the photoresist layer to expose the top portion of the interpoly oxide layer;
  etching the exposed top portion whereby the initial thickness of the top portion is reduced to the second thickness; the second thickness being from about 45 to 155Å.

14. The method of claim 10, wherein the initial thickness of the top portion of the interpoly oxide layer is reduced to the second thickness by:

forming a photoresist layer over the interpoly oxide layer to at least cover the top portion of the interpoly oxide layer;

etching back the photoresist layer to expose the top portion of the interpoly oxide layer;

etching the exposed top portion whereby the initial thickness of the top portion is reduced to the second thickness; the second thickness being from about 50 to 150Å.

15. The method of claim 10, wherein the initial thickness of the top portion is reduced to the second thickness by:

forming a photoresist layer over the interpoly oxide layer to at least cover the top portion of the interpoly oxide layer;

etching back the photoresist layer to expose the top portion of the interpoly oxide layer;

etching the exposed top portion to reduce the initial thickness of the top portion is reduced to an intermediate thickness of less than about 45 to 155Å; and forming additional interpoly oxide on the etched exposed top portion to increase the intermediate thickness to the second thickness of from about 45 to 155Å.

16. The method of claim 10, wherein the initial thickness of the top portion is reduced to the second thickness by:

forming a photoresist layer over the interpoly oxide layer to at least cover the top portion of the interpoly oxide layer;

etching back the photoresist layer to expose the top portion of the interpoly oxide layer;

etching the exposed top portion to reduce the initial thickness of the top portion to an intermediate thickness of less than about 50 to 150Å; and forming additional interpoly oxide on the etched exposed top portion to increase the intermediate thickness to the second thickness of from about 50 to 150Å.

17. A method of fabricating a floating gate/word line device, comprising the steps:

providing a semiconductor structure;

forming a floating gate portion over the semiconductor structure; the floating gate portion having side walls and a top portion;

forming a poly-oxide portion over the top surface of the floating gate;

forming an interpoly oxide layer over the semiconductor structure, the floating gate portion, and the poly-oxide portion; the floating gate portion having an initial thickness and including:

a word line region portion over at least a portion of the semiconductor structure adjacent the floating gate portion;

side wall area portions over the floating gate portion side walls; and a top portion over the poly oxide portion;

forming a photoresist layer over the interpoly oxide layer to at least cover the top portion of the interpoly oxide layer;

etching back the photoresist layer to expose the top portion of the interpoly oxide layer;

etching the exposed top portion whereby the initial thickness of the top portion is reduced to a second thickness;

forming a polysilicon layer over the interpoly oxide layer; and patterning the structure to form a floating gate/word line device.

18. The method of claim 17, wherein the photoresist layer is from about 2800 to 8200 thick over word line region portion and is from about 1300 to 6200Å thick over the top portion.

19. The method of claim 17, wherein the photoresist layer is from about 3000 to 8000Å thick over the word line region portion and is from about 1500 to 6000Å thick over the top portion.

20. The method of claim 17, wherein the floating gate portion is from about 900 to 1100Å thick and from about 1100 to 1300Å wide; the interpoly oxide layer initial thickness is from about 140 to 410Å; and the second thickness of the top portion of the interpoly oxide layer is from about 45 to 155Å.

21. The method of claim 17, wherein the floating gate portion is about 1000Å thick and about 1200A wide; the interpoly oxide layer initial thickness is from about 150 to 400Å; and the second thickness of the top portion of the interpoly oxide layer is from about 50 to 150Å.

22. The method of claim 17, wherein the second thickness of the top portion of the interpoly oxide layer is less than from about 45 to 155Å and further includes the step of:

forming an additional interpoly oxide on the etched exposed top portion of the interpoly oxide layer to increase the second thickness to a final thickness of from about 45 to 155Å.

23. The method of claim 17, wherein the second thickness of the top portion of the interpoly oxide layer is less than from about 50 to 150Å and further includes the step of:

forming an additional interpoly oxide on the etched exposed top portion of the interpoly oxide layer to increase the second thickness to a final thickness of from about 50 to 150Å.

* * * * *